(12) United States Patent
Breitwisch et al.

(10) Patent No.: US 8,648,326 B2
(45) Date of Patent: Feb. 11, 2014

(54) PHASE CHANGE MEMORY ELECTRODE WITH SHEATH FOR REDUCED PROGRAMMING CURRENT

(75) Inventors: Matthew J. Breitwisch, Pound Ridge, NY (US); Bipin Rajendran, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 13/191,490

(22) Filed: Jul. 27, 2011

(65) Prior Publication Data

US 2013/0026436 A1    Jan. 31, 2013

(51) Int. Cl.
*H01L 45/00* (2006.01)

(52) U.S. Cl.
USPC ............................ 257/4; 257/2; 257/E45.002

(58) Field of Classification Search
CPC .......................... H01L 45/124; H01L 45/1286
USPC .................................. 257/3, 4, 5, E45.002, 2
See application file for complete search history.

(56) References Cited

U.S. PATENT DOCUMENTS

| 2007/0051936 A1* | 3/2007 | Pellizzer et al. | 257/4 |
| 2007/0235712 A1* | 10/2007 | Harshfield et al. | 257/5 |
| 2008/0116437 A1* | 5/2008 | Oh et al. | 257/2 |

* cited by examiner

*Primary Examiner* — Jerome Jackson, Jr.
*Assistant Examiner* — Paul Budd
(74) *Attorney, Agent, or Firm* — Ido Tuchman; Vazken Alexanian

(57) ABSTRACT

An example embodiment is a phase change memory cell that includes a bottom contact and an electrically insulating layer disposed over the bottom contact. The electrically insulating layer defines an elongated via. Furthermore, a bottom electrode is disposed at least partially in the via. The bottom electrode includes a sleeve of a first electrically conductive material surrounding a rod of a second electrically conductive material. The first electrically conductive material and the second electrically conductive material have different specific electrical resistances. The memory cell also includes a phase change layer electrically coupled to the first electrode.

14 Claims, 6 Drawing Sheets

PHASE CHANGE MEMORY ELECTRODE WITH SHEATH FOR REDUCED PROGRAMMING CURRENT

BACKGROUND

The present invention is directed toward semiconductor circuits, and more particularly to phase change memory cells and methods for fabrication such cells.

Programming a phase change memory cell generally requires passing a program current through phase change material. The program current causes some or all of the phase change material to melt. It is generally desirable to reduce the program current needed to melt the phase change material. Typically, smaller program currents require smaller access transistors. Smaller access transistors allow for a higher memory cell density in a given wafer die.

Traditional approaches to reducing the program current include reducing the cross sectional area of memory cell electrodes and/or increasing the resistivity of the electrode material. Other approaches include increasing the resistivity of the phase change material.

SUMMARY

One example of the present invention is a phase change memory cell. The memory cell includes a bottom contact and an electrically insulating layer disposed over the bottom contact. The electrically insulating layer defines an elongated via. Furthermore, a bottom electrode is disposed at least partially in the via. The bottom electrode includes a sleeve of a first electrically conductive material surrounding a rod of a second electrically conductive material. The first electrically conductive material and the second electrically conductive material have different specific electrical resistances. The memory cell also includes a phase change layer electrically coupled to the first electrode.

Another example of the invention is a method for constructing a phase change memory cell. The method includes forming a via within an insulating material. A depositing step deposits a sleeve layer composed of a first electrically conductive material within the via. Another depositing step deposits a rod layer composed of a second electrically conductive material over the sleeve layer. The first electrically conductive material and the second electrically conductive material have different specific electrical resistances. Furthermore, the sleeve layer surrounds the rod layer within the via. An additional depositing step deposits a phase change layer over the rod layer and the sleeve layer such that the phase change memory layer is electrically coupled to the rod layer and the sleeve layer.

DETAILED DESCRIPTION

Figure 1:
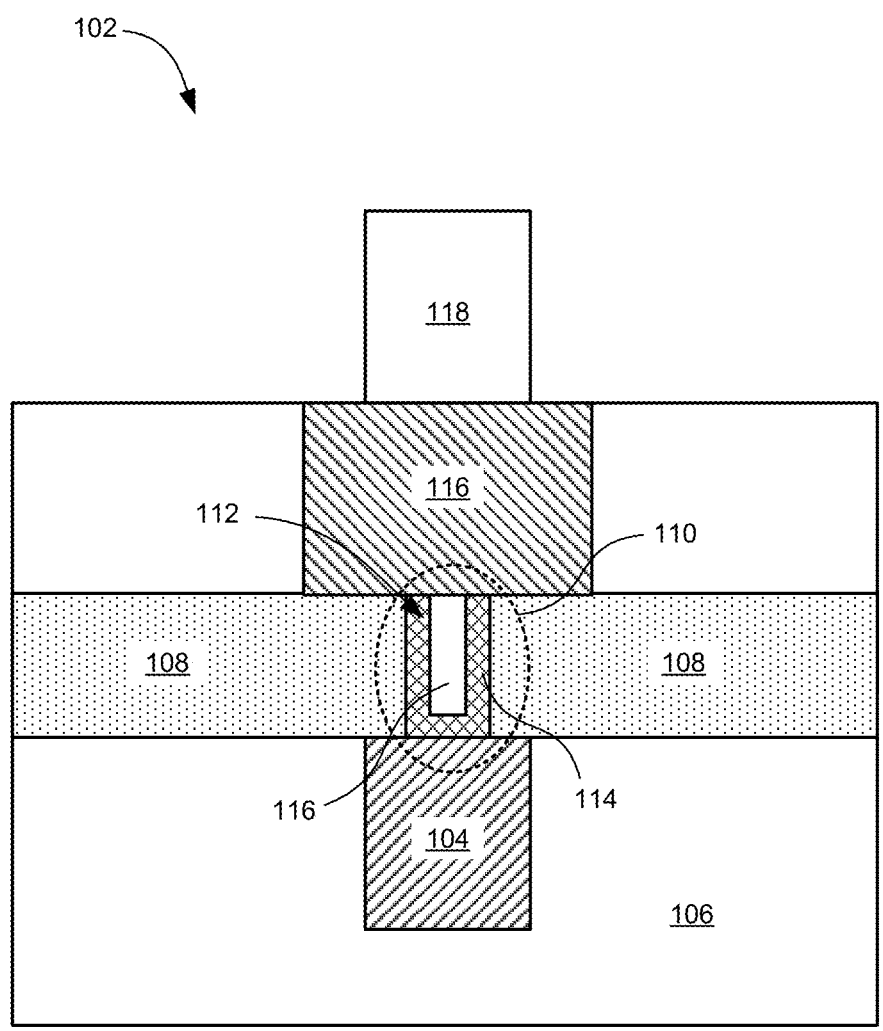
FIG. 1 shows an example phase change memory cell contemplated by the present invention.

The present invention is described with reference to embodiments of the invention. Throughout the description of the invention reference is made to FIGS. 1-6. When referring to the figures, like structures and elements shown throughout are indicated with like reference numerals.

Turning now to FIG. 1, an example phase change memory cell 102 contemplated by the present invention is shown. The memory cell 102 includes an electrically conducting bottom contact 104 fabricated on a wafer substrate 106. In one embodiment, the bottom contact 104 is made of tungsten (W). An electrically insulating layer 108 is disposed over the bottom contact 104. In one embodiment, the electrically insulating layer 108 is made of silicon nitride (SiN). Furthermore, the electrically insulating layer 108 defines an elongated via 110.

A bottom electrode 112 is disposed at least partially in the via 110. The bottom electrode 112 includes a sleeve 114 made of a first electrically conductive material. The sleeve 114 surrounds a rod 116 made of a second electrically conductive material. As discussed in more detail below, the first electrically conductive material and the second electrically conductive material have different specific electrical resistances.

In one embodiment, the sleeve 114 is closed at one end and open at an opposite end. The rod 116 is contained within the closed end of the sleeve 114 and does not directly contact the bottom contact 104.

A phase change layer 116 comprising phase change material is electrically coupled to the first electrode 112. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

In one embodiment, glass chalcogenides are utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used as phase change material cell as long as they can retain separate amorphous and crystalline states.

The phase change memory cell 102 further includes a top electrode 118 electrically coupled to the phase change memory layer 116. Thus, the phase change layer 116 is positioned between the bottom electrode 112 and the top electrode 118. With the appropriate application of current to the phase change layer 116 through the bottom electrode 112 and top electrode 118, at least a portion of the phase change layer 116 can melt and change phase.

As mentioned above, the first electrically conductive material at the sleeve 114 has a different specific electrical resistance than the second electrically conductive material at the rod 116. For example, first electrically conductive material may be tantalum nitride (TaN) and the second electrically conductive material may be titanium nitride (TiN). In one embodiment, the second electrically conductive material may be TiN, TiAlN and/or TiSiN. In another embodiment, the first electrically conductive material may be titanium aluminum nitride (TiAlN) and/or titanium silicon nitride (TiSiN), and the second electrically conductive material is titanium nitride (TiN). Example resistivities of the sleeve material are 1e-4 Ohm-m to 5e-4 Ohm-m. Example resistivities of rod material are 0.2e-5 Ohm-m to 5e-5 Ohm-m.

In a particular embodiment, the specific electrical resistance of the first electrically conductive material is at least two times more than the specific electrical resistance of the second electrically conductive material. Furthermore, the specific electrical resistance of the electrically insulating layer 108 is at least 50 times more than the specific electrical resistance of the first electrically conductive material.

In one embodiment, the first electrically conductive material and the second electrically conductive material have different thermal conductivity. For example, the thermal conductivity of the second electrically conductive material is at least two times greater than first electrically conductive material.

Figure 2:
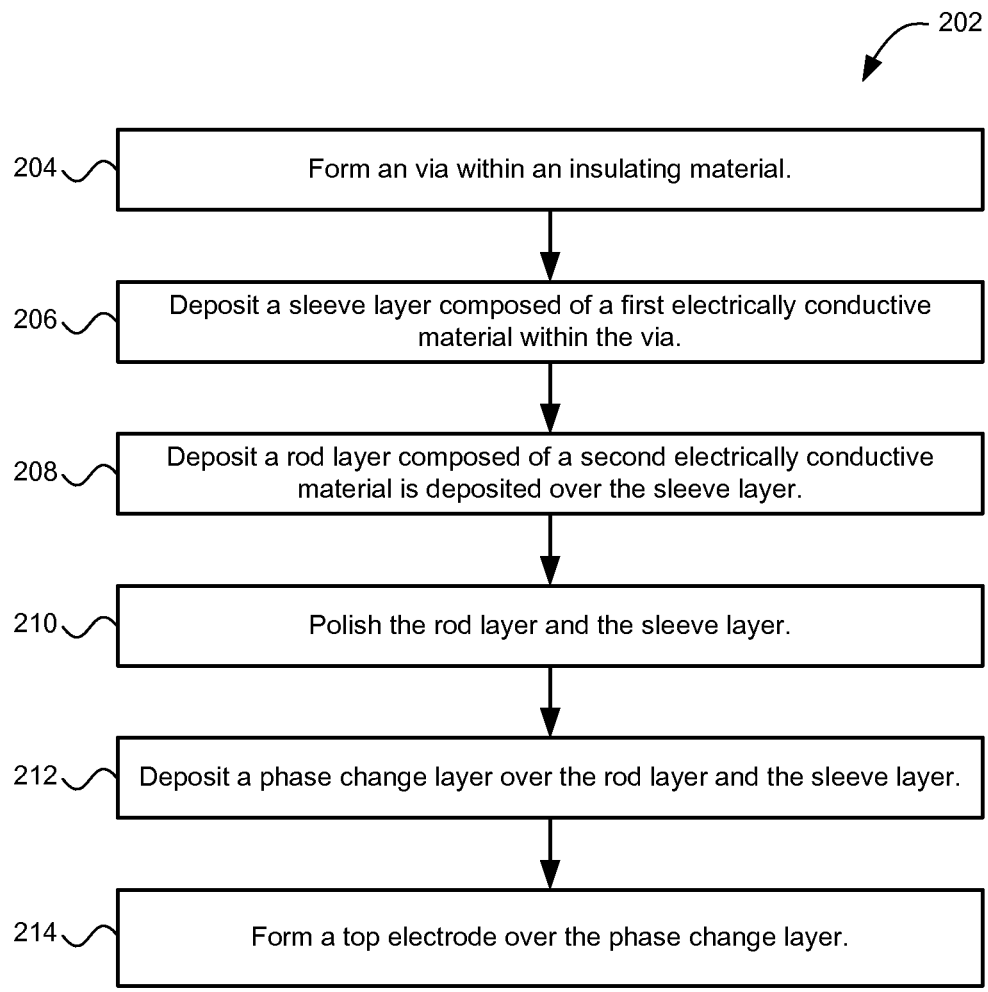
FIG. 2 shows an example process for constructing a phase change memory cell contemplated by the present invention.

Turning to FIG. 2, an example process 202 for constructing a phase change memory cell contemplated by the present invention is shown. The process includes a forming operation 204 to form a via within an insulating material. As discussed above, the via is disposed above a bottom contact.

Figure 3:
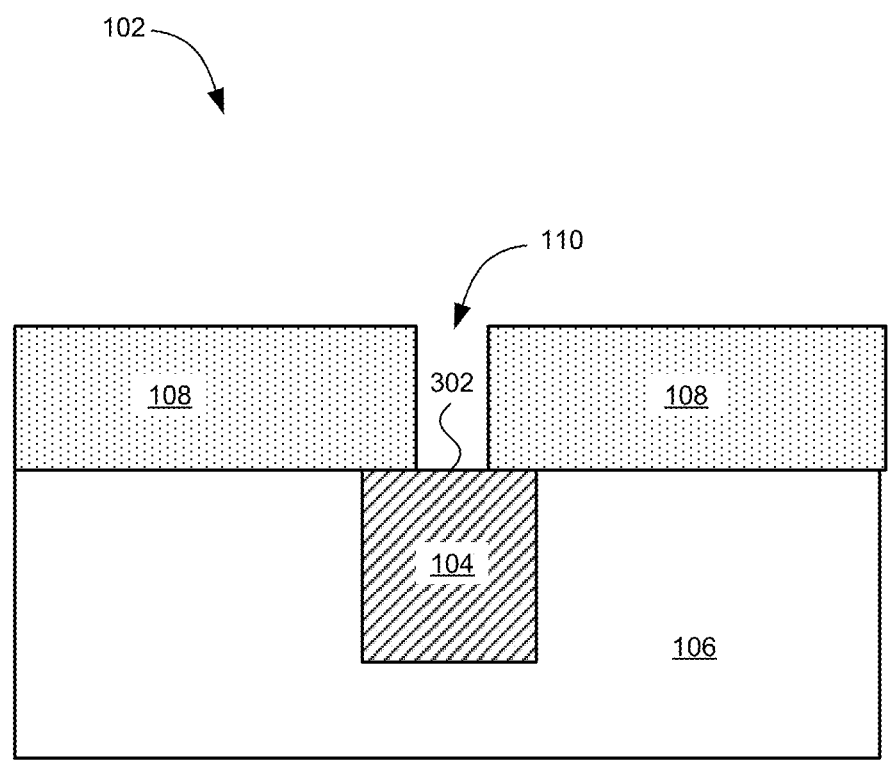
FIG. 3 shows the formation of a via within an insulating material.
Figure 4:
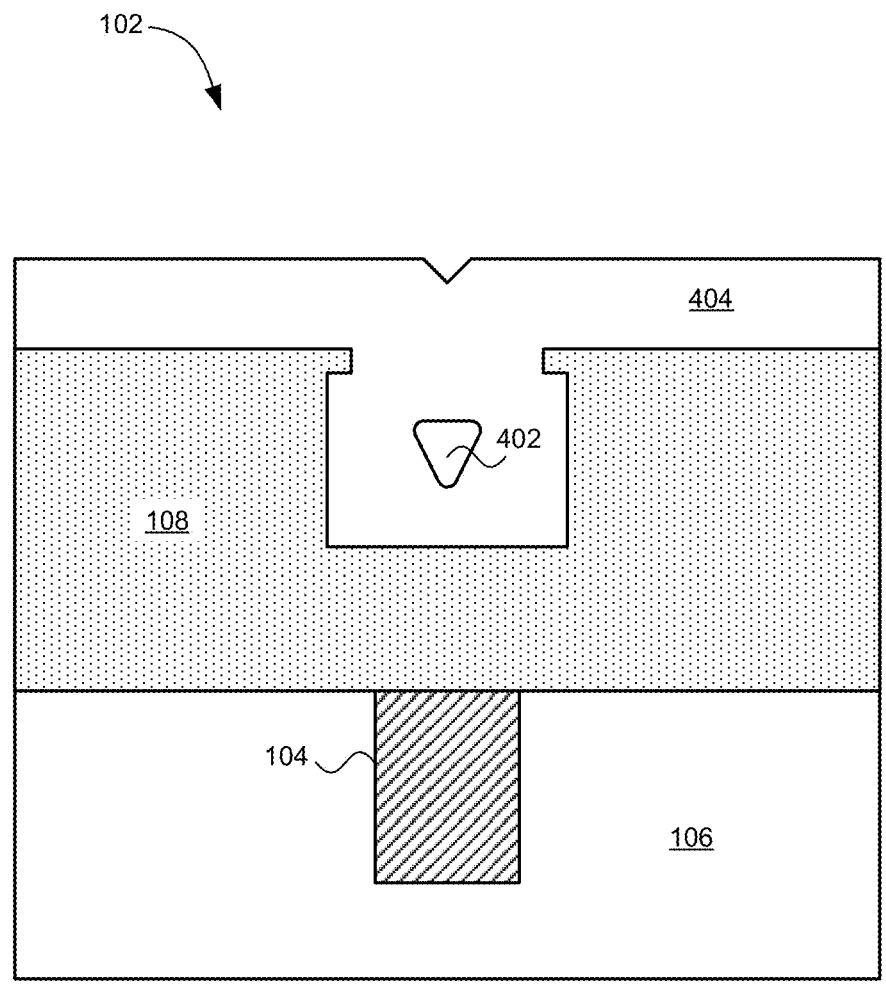
FIG. 4 shows the via formed by creating a keyhole within a conformal dielectric layer.

FIG. 3 shows the formation of the via 110 within the insulating material 108. As illustrated, the via 110 exposes a surface 302 of the bottom contact 104. As shown in FIG. 4, the via 110 may be formed by creating a keyhole 402 within a conformal dielectric layer 404. The conformal dielectric layer 404 is then etched through the keyhole.

Turning back to FIG. 2, the process may next include depositing operation 206 that deposits a sleeve layer composed of a first electrically conductive material within the via. The sleeve layer may be deposited using atomic layer deposition (ALD). In one embodiment, as shown in FIG. 1, the sleeve layer 114 is deposited entirely over a surface of the bottom contact exposed by the via such that the rod layer does not directly contact the bottom contact. After depositing operation 206 is completed, process flow continues to depositing operation 208.

At depositing operation 208, a rod layer composed of a second electrically conductive material is deposited over the sleeve layer. The rod layer may be deposited using chemical vapor deposition (CVD). In one embodiment, as shown in FIG. 1, the sleeve layer 114 surrounds the rod layer 116 within the via such that the rod layer 116 does not directly contact the bottom contact 104.

As discussed above, the first electrically conductive material and the second electrically conductive material have different specific electrical resistances. For example, the specific electrical resistance of the first electrically conductive material may be at least two times more than the specific electrical resistance of the second electrically conductive material. Furthermore, the specific electrical resistance of the insulating material may be at least 50 times more than the specific electrical resistance of the first electrically conductive material.

Additionally, first electrically conductive material and the second electrically conductive material may have different thermal conductivity. For example, the thermal conductivity of the second electrically conductive material is at least two times greater than first electrically conductive material. In one embodiment, the first electrically conductive material may be tantalum nitride (TaN) and the second electrically conductive material may be titanium nitride (TiN).

After depositing operation 208 is completed, the process continues to polishing operation 210. During this operation, the rod layer and the sleeve layer are polished down to the same level as the insulating material. For example, a chemical-mechanical polish (CMP) may be performed. After polishing operation 210 is completed, process flow moves to depositing operation 212.

At depositing operation 212, a phase change layer is deposited over the rod layer and the sleeve layer. In this way, the phase change memory layer is electrically coupled to the rod layer and the sleeve layer. The phase change material 202 may include, for example, $Ge_2Sb_2Te_5$, SbTe or $In_2Se_3$. After depositing operation 212 is completed, process flow moves to forming operation 214.

At forming operation 214, a top electrode is formed over the phase change layer. Thus, the phase change layer is capped with an electrically conducting material to allow current to flow through the phase change layer.

In accordance with embodiments of the present invention, the programming current for programming the phase change memory element is reduced by reducing the effective cross-sectional area of a phase change memory electrode. The electrode includes a moderately high resistivity material on the outside of a conductive region of the electrode. The moderately high resistivity sheath layer confines the current and reduces the required reset current of the phase change memory cell. Furthermore, the sheath may also act as a heat shield.

Figure 5:
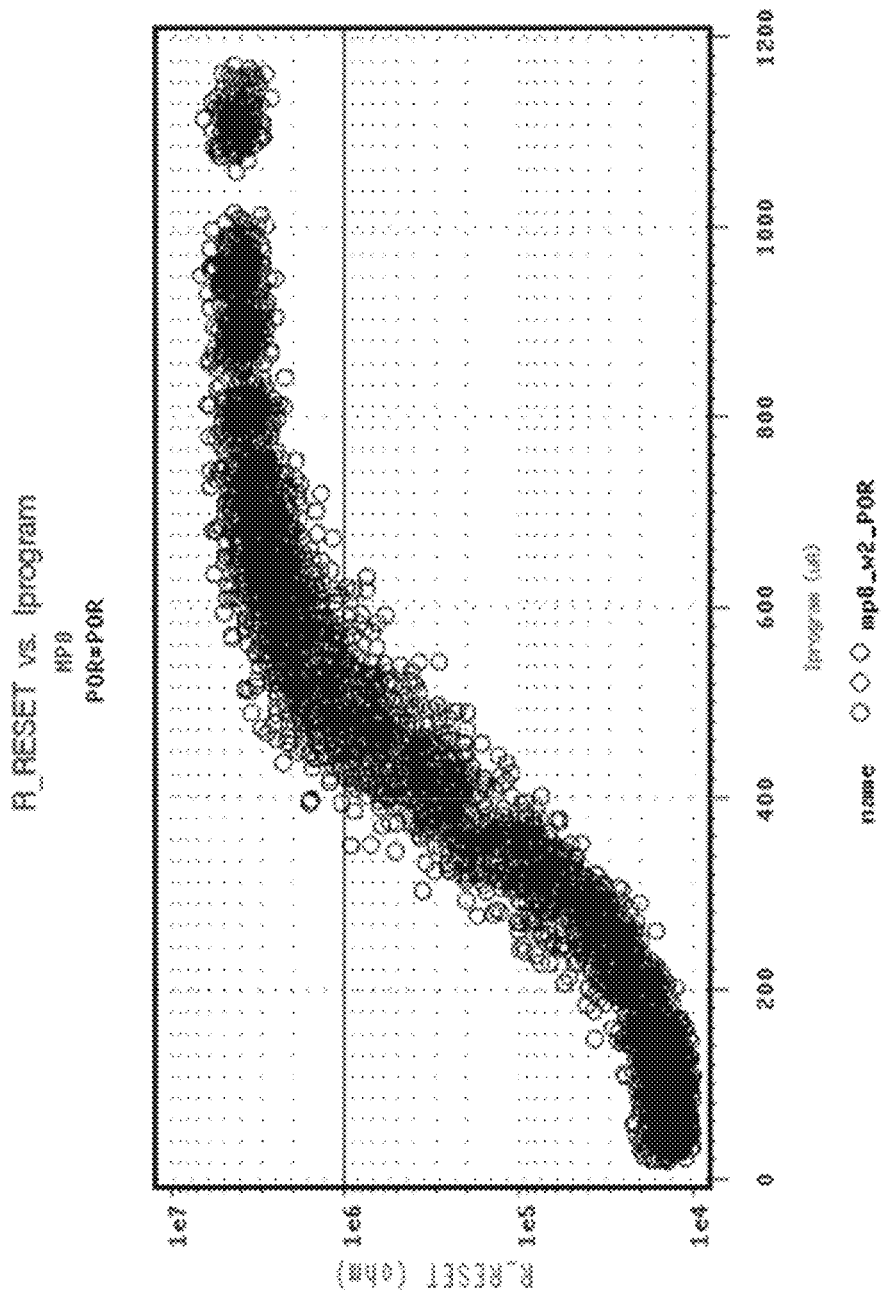
FIG. 5 shows a graph of experimental measurements of memory cell resistance after application of reset pulses through a solid TiN bottom electrode.
Figure 6:
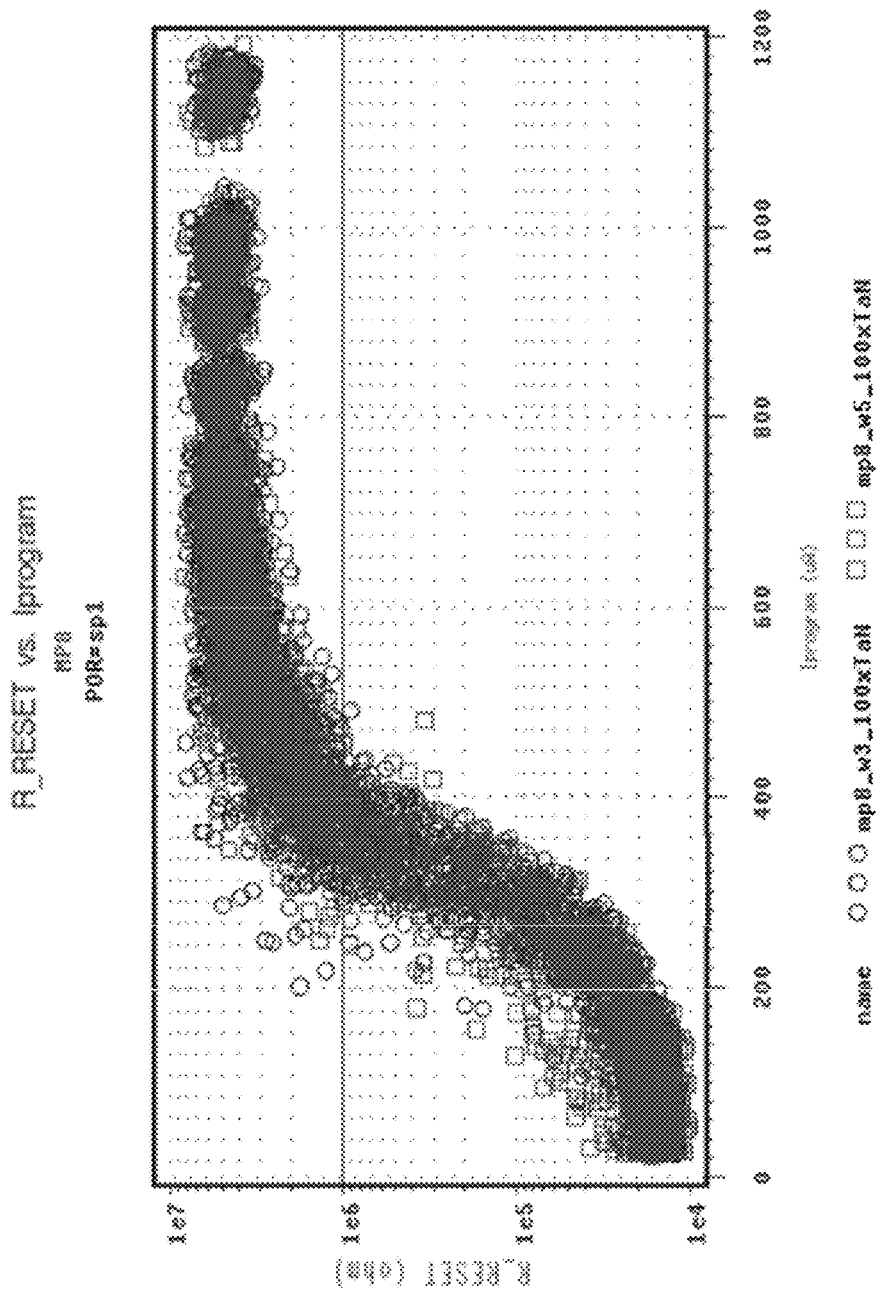
FIG. 6 shows a graph of experimental measurements of memory cell resistance after application of reset pulses through a bottom electrode with a TaN sleeve layer and a TiN rod layer.

The inventive cell requires a smaller reset current to melt the required volume of phase change material for the same cross section of conducting material as compared with the prior art. FIG. 5 shows a graph of experimental measurements of memory cell resistance after application of reset pulses through a solid TiN bottom electrode. By contrast, FIG. 6 shows a graph of experimental measurements of memory cell resistance after application of reset pulses through a bottom electrode with a TaN sleeve layer and a TiN rod layer. It can be seen that the overall resistance of the cell structure in FIG. 6 has not gone up (lower left hand side of graph). Only the amount of current needed to program the cell has decreased. Moreover, a lower memory cell resistance allows the memory cell to be read faster.

Having described embodiments for the invention (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A phase change memory cell comprising:
   a bottom contact;
   an electrically insulating layer disposed over the bottom contact, the electrically insulating layer defining a via;
   a bottom electrode disposed at least partially in the via, the bottom electrode including a sleeve of a first electrically conductive material surrounding a rod of a second electrically conductive material, the first electrically conductive material and the second electrically conductive material having different specific electrical resistances; and a phase change layer electrically coupled to the bottom electrode; and wherein the first electrically conductive material is tantalum nitride (TaN) and the second electrically conductive material is titanium nitride (TiN).

2. The phase change memory cell of claim 1, wherein the sleeve is closed at a distal end and open at a proximate end, such that the rod is contained within the distal end of the sleeve and does not directly contact the bottom contact.

3. The phase change memory cell of claim 1, wherein the specific electrical resistance of the first electrically conductive material is at least two times more than the specific electrical resistance of the second electrically conductive material.

4. The phase change memory cell of claim 3, wherein the specific electrical resistance of the electrically insulating layer is at least 50 times more than the specific electrical resistance of the first electrically conductive material.

5. The phase change memory cell of claim 1, wherein the first electrically conductive material and the second electrically conductive material have different thermal conductivity.

6. The phase change memory cell of claim 5, wherein the thermal conductivity of the second electrically conductive material is at least two times greater than first electrically conductive material.

7. The phase change memory cell of claim 5, wherein the thermal conductivity of the second electrically conductive material is at least two times greater than first electrically conductive material.

8. The phase change memory cell of claim 1, further comprising a top electrode electrically coupled to the phase change layer such that the phase change layer is positioned between the bottom electrode and the top electrode.

9. The phase change memory cell of claim 1, further comprising a top electrode electrically coupled to the phase change layer such that the phase change layer is positioned between the bottom electrode and the top electrode.

10. A phase change memory cell comprising:
a bottom contact;
an electrically insulating layer disposed over the bottom contact, the electrically insulating layer defining a via;
a bottom electrode disposed at least partially in the via, the bottom electrode including a sleeve of a first electrically conductive material surrounding a rod of a second electrically conductive material, the first electrically conductive material and the second electrically conductive material having different specific electrical resistances; and
a phase change layer electrically coupled to the bottom electrode; and
wherein the first electrically conductive material is at least one of titanium aluminum nitride (TiAlN) and titanium silicon nitride (TiSiN), and the second electrically conductive material is titanium nitride (TiN).

11. The phase change memory cell of claim 10, wherein the sleeve is closed at a distal end and open at a proximate end, such that the rod is contained within the distal end of the sleeve and does not directly contact the bottom contact.

12. The phase change memory cell of claim 10, wherein the specific electrical resistance of the first electrically conductive material is at least two times more than the specific electrical resistance of the second electrically conductive material.

13. The phase change memory cell of claim 12, wherein the specific electrical resistance of the electrically insulating layer is at least 50 times more than the specific electrical resistance of the first electrically conductive material.

14. The phase change memory cell of claim 10, wherein the first electrically conductive material and the second electrically conductive material have different thermal conductivity.

* * * * *